United States Patent [19]

Ozbirn et al.

[11] 4,152,616
[45] May 1, 1979

[54] PIEZOELECTRIC CRYSTAL MOUNTING

[75] Inventors: Willie P. Ozbirn, Sandwich, Ill.; Jack A. English; James N. Hufford, both of Elkhart, Ind.

[73] Assignee: CTS Corporation, Elkhart, Ind.

[21] Appl. No.: 595,373

[22] Filed: Jul. 14, 1975

[51] Int. Cl.² ............................................. H01L 41/10
[52] U.S. Cl. ..................................... 310/344; 310/352
[58] Field of Search .................. 310/9.1, 9.4, 351–353; 58/23 AC, 23 V

[56] References Cited

U.S. PATENT DOCUMENTS

| | | | |
|---|---|---|---|
| 2,513,870 | 7/1950 | Hoffman | 310/9.4 X |
| 2,546,321 | 3/1951 | Ruggles | 310/9.4 |
| 3,073,975 | 1/1963 | Bigler et al. | 310/9.4 X |
| 3,735,166 | 5/1973 | Bradley | 310/9.1 |
| 3,913,195 | 10/1975 | Beaver | 310/9.4 X |

Primary Examiner—Mark O. Budd
Attorney, Agent, or Firm—John J. Gaydos

[57] ABSTRACT

A piezoelectric crystal comprising an elongated bar-shaped crystal having a pair of parallel spaced lead wires depending orthogonally from nodal points on one surface of the crystal and an elongated bar-shaped base in spaced relationship to the crystal and supporting the lead wires. The base is provided with conical shape holes with the larger diameter ends thereof proximal to the crystal, and sealing and securing means locate the hermetical seal between the lead wires and the base distal from the crystal enabling the lead wires to vibrate freely within the conical holes of the base. The length of the lead wires between the crystal and the point of attachment to the base is one-quarter wave length to return to the crystal a maximum percentage of the vibrational energy transmitted into the lead wires from the crystal thereby minimizing energy dissipation of the crystal while maintaining both a minimum distance between the crystal and the base and providing a minimum package size for the crystal. A cover cooperates with portions of the base to enclose the crystal.

13 Claims, 5 Drawing Figures

U.S. Patent  May 1, 1979  4,152,616
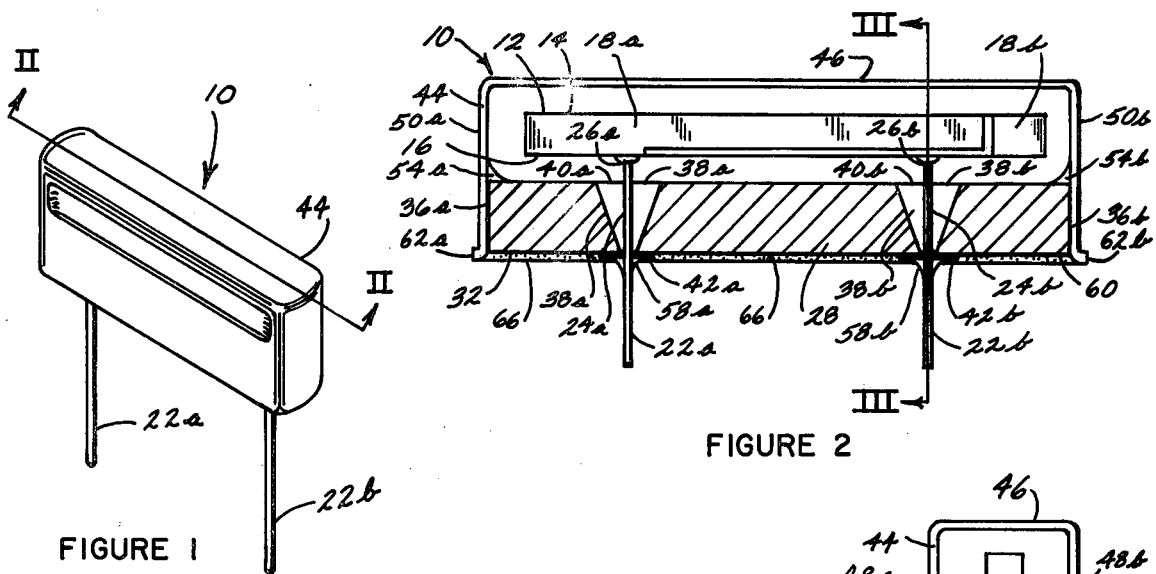
FIGURE 1
FIGURE 2
FIGURE 3
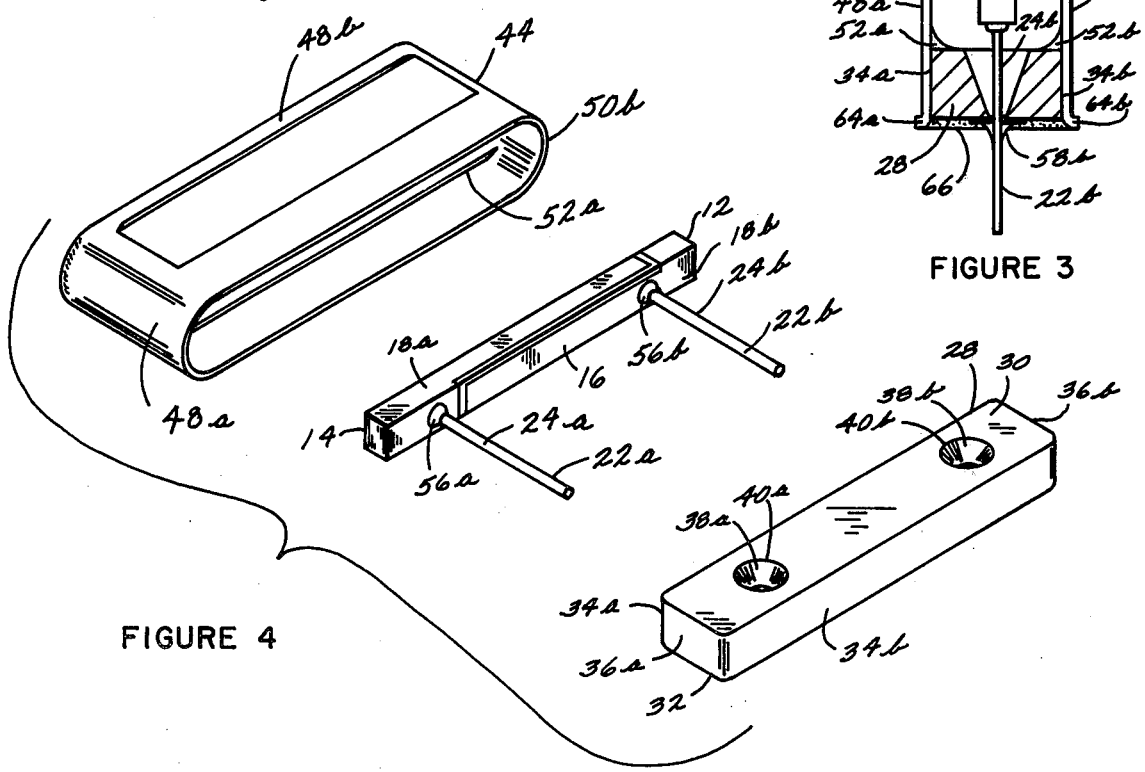
FIGURE 4
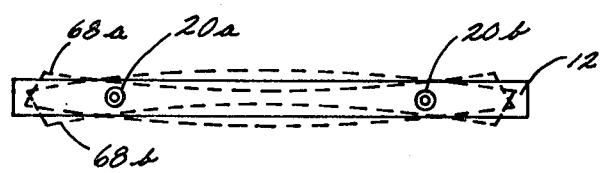
FIGURE 5

PIEZOELECTRIC CRYSTAL MOUNTING

This invention relates generally to piezoelectric devices and, more particularly, to a piezoelectric crystal assembly commonly used in electronic circuits.

In U.S. Pat. No. 3,735,166, of common assignee, a piezoelectric crystal assembly is disclosed in which a pair of lead wires are attached orthogonally to nodal points on one surface of a crystal of x-y cut, the lead wires extend through and are soldered to a pair of thin tubular and parallel disposed fittings in a base, a cover is attached to the base to enclose the crystal, and the portion of the lead wires intermediate the tubular fittings and the crystal are proportioned in length and diameter to return to the crystal a maximum percentage of the vibrational energy imparted to the lead wires by the crystal, so that the energy of the crystal is not dissipated by the mounting thereof. It would, therefore, be preferable to improve upon the device shown in the aforementioned patent by reducing the required length of lead wire between the crystal and the base and achieving a smaller size package or assembly.

The operating efficiency of a crystal depends upon many factors, one of the factors being the length of the portion of each of the lead wires from the crystal to the point of securement of the lead wires to a base. Preferably, when the lengths of the portions of the lead wires are one-quarter wave length, the vibrational energy imparted to the lead wires from the crystal when energized is substantially returned to the crystal. Difficulties in securing at a predetermined point, the lead wires to the base or to a tubulation provided in the base are usually encountered since the metal, e.g., liquid solder, flows from the base or tubulation distal of the crystal by capillarity. Frequently, the metal does not flow up the tubulations to the desired point of securement of the lead wires at one-quarter wave length. Securing the lead wires other than at the desired point equal to one-quarter wave length permits vibrational energy imparted to the lead wires from the crystal to be partially dissipated instead of returned to the crystal; therefore, more energy is required to drive the crystal. It would, therefore, be preferable to control more precisely and effectively, the free vibrational length of the lead wire between the crystal and the point of securement to the base.

Accordingly, an object of the present invention is to provide an improved crystal package.

Another object of the present invention is to reduce the size of the crystal package to allow its use in small electronic watches.

A further object of the present invention is to provide an improved crystal package wherein the effective length of the lead wires supporting the crystal is more precisely controlled.

Still another object of the present invention is to provide an improved crystal package by minimizing the transmission of vibrational energy from the crystal to the supporting structure.

Yet another object of the present invention is to provide an improved crystal package having lead wires connected to a crystal and secured to the base distal of the crystal.

Yet a further object of the present invention is to provide an improved crystal package having the lead wires depending from the crystal secured to the base distal of the crystal and wherein a portion of the lead wires above the securement to the base can vibrate freely in holes provided in the base.

Still another object of the present invention is to provide a crystal package employing a ceramic base having spaced electrically isolated conical holes receiving the lead wires connected to the crystal.

Further objects and advantages of the present invention will become apparent as the following description proceeds, and the features of novelty characterizing the invention will be pointed out with particularity in the claims annexed to and forming a part of this specification.

According to the broader aspects of this invention, there is provided a piezoelectric crystal assembly comprising a piezoelectric crystal having a pair of electrodes secured to the crystal. A pair of lead wires are fastened to respective ones of the electrodes. A base of dielectrical material has an inner surface in spaced relationship to the lower surface of the crystal. The base is also provided with a pair of conical holes extending through the base in spaced electrically isolated relationship to each other and orthogonal to the inner surface of the base with the larger diameter end of each hole opening into the inner surface of the base and receiving the lead wires. The lead wires are attached to the base and hermetically sealed therewith distal from the crystal thereby allowing the lead wires to freely vibrate inside the conically shaped holes as well as between the inner surface of the base and the lower surface of the crystal. A cover assembled over the crystal engages the base and cooperates with the base enclosing the crystal. The cover extends orthogonally beyond the distal or outer surface of the base and cooperates therewith to provide an encapsulating well. The encapsulating well is filled with a sealing material, e.g., epoxy, and provides a hermetic seal between the base and the cover and also further hermetically seals the openings between the lead wires and the conical holes.

For a better understanding of the present invention, reference may be had to the accompanying drawings wherein the same reference numerals have been applied to like parts and wherein:

FIG. 1 is an isometric view of the crystal assembly of the present invention;

FIG. 2 is an enlarged longitudinal cross-sectional view of the crystal assembly taken substantially along section line II—II of FIG. 1;

FIG. 3 is a cross-sectional view taken substantially as shown along line III—III of FIG. 2, assuming FIG. 2 is shown in full;

FIG. 4 is an exploded plan view of the crystal assembly as shown in FIG. 1; and

FIG. 5 is a bottom plan view of the crystal shown in FIG. 2 showing by phantom lines, the oscillation of the crystal about the nodal points thereof.

Referring now to the drawings, and more particularly to FIGS. 1 and 2, a piezoelectric crystal assembly, generally indicated at 10, includes an elongated bar-shaped quartz crystal 12 of x-y cut having an upper surface 14, a lower surface 16 parallel to the upper surface 14, a pair of wrap-around electrodes 18a, 18b encompassing respective ones of a pair of nodal points 20a, 20b (FIG. 5) on the lower surface 16. The crystal assembly 10 also includes a pair of lead wires 22a, 22b having straight portions 24a, 24b. The upper ends 26a, 26b of the lead wires are solder attached respectively to the nodal points 20a, 20b orthogonally to the lower surface 16 so that the straight portions 24a, 24b are disposed in parallel relationship to each other.

Referring now to FIGS. 2-4, the crystal assembly 10 also includes an elongated and substantially bar-shaped base 28 having a planar inner surface 30, a planar outer surface 32 in spaced parallel relationship to the planar inner surface 30, a pair of long side surfaces 34a, 34b interconnecting the inner and outer surfaces 30, 32 and orthogonally disposed thereto and a pair of short side surfaces 36a, 36b disposed substantially orthogonally to the long side surfaces 34a, 34b. The base is also provided with a pair of conical holes 38a, 38b disposed orthogonally to the inner surface 30 with the larger ends 40a, 40b of the holes opening into the inner surface 30. Metallized surface portions or pads 42a, 42b on the outer surface 32 encompass the openings of the holes 38a, 38b.

The piezoelectric crystal assembly 10, as shown in FIGS. 2-4, further includes an enclosing cover 44 having a substantially elongated and planar cover portion 46, a pair of long wall portions 48a, 48b, a pair of short wall portions 50a, 50b, a pair of base locating stops 52a, 52b on the long wall portions 48a, 48b, and a pair of base locating stops 54a, 54b on the short wall portions 50a, 50b.

In assembly, the wrap-around electrodes 18a, 18b are metallized to portions of the crystal 12, the ends 26a, 26b of the lead wires 22a, 22b are secured with metal deposits, e.g., solder fillets 56a, 56b, to the electrodes 18a, 18b at the nodal points 20a, 20b, and the lead wires 22a, 22b are inserted through the conical holes 38a, 38b in the base 28. The lower surface 16 of the crystal 12 is positioned in spaced parallel relationship to the inner surface 30 of the base 28 and the lead wires are connected at a point equal to one-quarter wave length to the metallized portions 42a, 42b of the base 28 by solder joints 58a, 58b. Since the conical shape of the holes 38a, 38b effectively prevents the solder joints 58a, 58b from forming inside the conical holes 38a, therefore, the vibrational lengths of the straight portions 24a, 24b of the lead wires 22a, 22b are precisely controlled. The base 28, with the lead wires 22a, 22b secured thereto and the crystal 12 soldered to the ends 26a, 26b of the lead wires 22a, 22b, is inserted into the upper portion of the cover 44 until the inner surface 30 of the base 28 abuts the base locating stops 52a, 52b, 54a, 54b.

Preferably, a well 60, defined by the outer surface 32 of the base 28 and the overhanging portions 62a, 62b, 64a, 64b of the enclosing cover 44 is filled with a suitable encapsulant 66, e.g., an epoxy material. The encapsulant 66 is effectively attached and hermetically seals the base 28 to the lower portion of the cover 44 and also additionally attaches and hermetically seals the lead wires 22a, 22b to the base 28.

In an optional construction, the solder joints 58a, 58b are omitted and only the epoxy material is used to seal the lead wires 22a, 22b to the base 28. Generally, two epoxy operations are required; one to fix the crystal position relative to the base, and the other to attach and hermetically seal the cover to the base.

Preferably, the base 28 is of a dielectric material, generally a ceramic, e.g., alumina, and the material for the cover 44 and the encapsulant 66 is preferably selected to provide substantially the same linear coefficient of expansion as that of the base. This prevents undue thermal stresses for damaging the bond and/or imparting stresses due to differences in thermal expansions between the epoxy material 66 and the enclosing cover 44 or between the epoxy material 66 and the base 28. One such metal commercially available under the trademark KOVAR, an alloy consisting of iron, cobalt, and nickel and having a linear coefficient of expansion of approximately $6.2 \times 10^{-6}$, is compatible with the alumina useable for the base.

Referring now to FIG. 5, the vibrational mode of the crystal 12 is shown by phantom lines 68a, 68b. It can readily be seen that even though the vibration of the crystal 12 is about the nodal points 20a, 20b, the lead wires 22a, 22b will be subjected to both torsional and bending vibrations from the oscillations of the crystal. The application of torsional vibrations to the lead wires 22a, 22b is apparent from the curvature of the phantom lines 68a, 68b. In like manner, it can be seen by inspection of FIG. 5 that the nodal points 20a, 20b are moved closer together each time the crystal oscillates to the shape depicted by the phantom lines 68a and again each time the crystal oscillates to the shape depicted by the phantom lines 68b; thus there are at least two cycles of bending vibrations imparted to the lead wires 22a, 22b for every oscillatory cycle of the crystal 12. Due to the complex vibrations imparted to the lead wires by the crystal, it is difficult to calculate theoretically the length of lead wire equal to one-quarter wave length of the operating frequency of the crystal. Consequently, the free vibratory length of lead wire is determined empirically.

The present invention is particularly effective in reducing the overall size of the crystal assembly 10 in that the straight portions 24a, 24b of the lead wires 22a, 22b are attached to the outer surface 32 of the bar-shaped base 28 thereby leaving the straight portions 24a, 24b free to vibrate in any direction within the conical holes 38a, 38b as well as between the crystal 12 and the base 28. Thus the distance between the crystal 12 and the surface 30 of the base 28 is reduced by the thickness of base 28 and the overall size of the assembly is also reduced accordingly, while still maintaining the lead wires at one-quarter wave length.

In a preferred configuration, the crystal oscillates at 32.768 KHz, the lead wires are 0.005 inches in diameter and are terminated to the outer surface of the base to provide a free vibratory length of approximately 0.065 inches, the free vibratory length being determined empirically as one-quarter wave length. In the same configuration, the base has a thickness of 0.046 inches. Thus, seventy percent (70%) of the required length of lead wires is received within the conical or tapered holes in the base and the overall size of the crystal assembly is appreciably reduced. The cost of the total assembly is also reduced since the base is one piece and the holes are provided in the base. Additionally, the present invention effectively reduces assembly stresses on the base 28 since the attaching of the cover 44 to the base 28 is by means of an encapsulant rather than be a cold welding operation.

The term "conical" denotes any substantially conical or tapered shape wherein the cross section of the cone intermediate the apex and the base is oval, circular or multisided.

While there has been illustrated and described what is at present considered to be a preferred embodiment of the present invention, it will be appreciated that numerous changes and modifications are likely to occur to those skilled in the art, and it is intended in the appended claims to cover all those changes and modifications which fall within the true spirit and scope of the present invention.

What is claimed as new and desired to be secured by Letters Patent of the United States is:

1. A piezoelectric crystal assembly comprising an elongated bar-shaped piezoelectric crystal having parallel spaced upper and lower surfaces thereon, a pair of longitudinally spaced nodal points on the lower surface, a pair of wrap-around electrodes encompassing respective one of the nodal points, a pair of lead wires each having a straight portion proximal to one end thereof, each lead wire having said one end fixedly and orthogonally attached to respective ones of the electrodes at respective ones of the nodal points, the straight portions extending orthogonally from the lower surface in spaced parallel relationship, an elongated and substantially bar-shaped base of dielectrical material having substantially parallel and planar inner and outer surfaces and having a pair of substantially parallel long side surfaces and a pair of short side surfaces intermediate of and substantially orthogonal to the inner and outer surfaces, the inner surface of the base being in spaced parallel and proximal relationship to the lower surface of the crystal and with the long side surfaces and the short side surfaces positioned to extend outwardly from the upper and lower surfaces of the crystal, the base being provided with a pair of conical holes extending orthogonally through the base with the larger diameter ends of the conical holes opening through the inner surface, the holes being in spaced relationship and corresponding to the respective locations of the nodal points, the straight portions of the lead wires being received in the conical holes, the portion of each of the lead wires adjacent to the inner surface and intersecting a plane thereof and extending substantially away from the inner surface and toward the outer surface being unsecured to the base, an enclosing cover having an upper portion disposed in spaced relationship to the crystal and a lower portion receiving the base, and means securing and hermetically sealing the lead wires to the base proximal to the outer surface and hermetically securing the enclosing cover to the base.

2. A piezoelectric crystal assembly comprising an elongated crystal having a surface including a pair of nodal points, a pair of spaced lead wires depending orthogonally from the surface at the nodal points and having free vibratory portions, an elongated base of dielectric material in spaced relationship to the crystal and having a pair of spaced electrically isolated holes in alignment with and receiving respective ones of the lead wires, the base having an inner surface proximal to the crystal and an outer surface distal from the crystal, a cover cooperating with portions of the base and enclosing the crystal, and attaching means hermetically sealing the lead wires to the base and the base to the cover, the pair of holes being larger in diameter proximal to the surface of the crystal and smaller in diameter distal from the surface of the crystal, the base being of unitary construction and the walls of the holes in the base being of dielectric material and being electrically isolated from each other, the attaching means effectively securing the lead wires closer to the outer surface than to the inner surface of the base.

3. A crystal assembly of claim 2, wherein the length of the vibratory portions of the lead wires from the crystal to the base distal from said crystal is substantially one-quarter wave length, whereby vibrational energy imparted to said lead wires from said crystal is substantially returned thereto.

4. A crystal assembly of claim 2, wherein said holes are conical in shape and are tapered from the inner surface to to the outer surface of the base.

5. A crystal assembly of claim 2, wherein the outer surface of the base has metallized surface portions substantially orthogonal to and encompassing the holes distal from said base, and the attaching means comprises metal deposits bonded to the metallized surface portions and to respective ones of the lead wires.

6. A crystal assembly of claim 2, wherein said base comprises an elongated bar-shaped piece of dielectrical material having the holes therethrough, whereby the electrical isolation of the holes is provided by said dielectrical material, and the attaching means comprises material bonded to the cover and to the base.

7. A piezoelectric crystal assembly comprising an elongated bar-shaped piezoelectric crystal having parallel spaced upper and lower surfaces thereon, a pair of longitudinally spaced nodal points on the lower surface, a pair of wrap-around electrodes encompassing respective one of the nodal points, a pair of lead wires each having a straight portion proximal to one end thereof, each lead wire having said one end fixedly and orthogonally attached to respective ones of the electrodes at respective ones of the nodal points, the straight portions extending orthogonally from the lower surface in spaced parallel relationship, an elongated and substantially bar-shaped base of dielectrical ceramic material having substantially parallel and planar inner and outer surfaces and having a pair of substantially parallel long side surfaces and a pair of short side surfaces intermediate of and substantially orthogonal to the inner and outer surfaces, the inner surface of the base being in spaced parallel and proximal relationship to the lower surface of the crystal and with the long side surfaces and the short side surfaces positioned to extend outwardly from the upper and lower surfaces of the crystal, the base being provided with a pair of conical holes extending orthogonally through the base with the larger diameter ends of the conical holes opening through the inner surface, the holes being in spaced relationship and corresponding to the respective locations of the nodal points, the straight portions of the lead wires being received in the conical holes, the length of the lead wires from the lower surface of the crystal to the outer surface of the base being approximately one-quarter wave length, an enclosing cover having an upper portion disposed in spaced relationship to the crystal and a lower portion receiving the base, the enclosing cover being formed of a metal having a linear coefficient of expansion substantially the same as the linear coefficient of expansion of the ceramic, the cover including a pair of base-locating stops inside the cover, the stops extending orthogonally inwardly from the inner surface of the cover and cooperating with the inner surface of the base and locating the base with respect to the cover, and means securing and hermetically sealing the lead wires to the base proximal to the outer surface and hermetically securing the enclosing cover to the base, the means comprising a metallized surface portion on the outer surface of the base substantially around each of the holes, a metal deposit bonded to each of the metallized surface portions and the respective ones of the lead wires, the lower portion of the cover extending beyond the outer surface of the base, and an encapsulant disposed against the outer surface of the base bonding the base to the enclosing cover and bonding to the base the portions of the lead wires depending from the metal deposits.

8. A piezoelectric crystal assembly comprising a base having a first surface and a second surface, said base being provided with a pair of electrically isolated spaced holes communicating with said surfaces, a crystal disposed in spaced relationship to the first surface, a pair of electrodes deposited on the crystal and electrically isolated from each other, a lead wire connected to each of the electrodes, the wires being received in the holes provided in the base, and means anchoring and fixedly securing the leads to the base at the second surface, the portion of each of the lead wires adjacent to the first surface and intersecting a plane thereof and extending substantially away from the first surface and toward the second surface being unsecured to the base whereby energization of the crystal enables the lead wires to vibrate freely in any direction within the holes in the base.

9. The crystal assembly of claim 8, wherein the distance from each of the lead wires to the edge of the respective hole at the second surface is less than the distance from each of the lead wires and the edge of the respective hole at the first surface.

10. The crystal assembly of claim 8, wherein metallized pads are bonded to the second surface and at least partially circumpose each of the holes, and metal deposits are bonded to the pads and to the lead wires and secure the lead wires to the base.

11. The crystal assembly of claim 8, wherein the pair of holes have a larger diameter proximal to the surface of the crystal and a smaller diameter distal from the surface of the crystal.

12. The crystal assembly of claim 8, wherein the holes are conical in shape and the lead wires are secured to the base only at the second surface.

13. The crystal assembly of claim 8, wherein the length of the lead wires from the crystal to the second surface of the base is substantially one-quarter wave length.

* * * * *